United States Patent
Lee et al.

(10) Patent No.: US 9,459,506 B2
(45) Date of Patent: Oct. 4, 2016

(54) LIQUID CRYSTAL DISPLAY

(71) Applicant: LG Display Co., Ltd., Seoul (KR)

(72) Inventors: Yangsik Lee, Gyeonggi-do (KR);
Jihyun Jung, Gyeonggi-do (KR);
Jaegyun Lee, Gyeonggi-do (KR); Ruda Rhe, Gyeonggi-do (KR);
Hyangmyoung Gwon, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 131 days.

(21) Appl. No.: 14/568,419

(22) Filed: Dec. 12, 2014

(65) Prior Publication Data

US 2016/0070145 A1    Mar. 10, 2016

(30) Foreign Application Priority Data

Sep. 10, 2014   (KR) .......................... 10-2014-0119610

(51) Int. Cl.
   *G02F 1/1343*    (2006.01)
   *G02F 1/1362*    (2006.01)
   *G02F 1/136*     (2006.01)

(52) U.S. Cl.
   CPC .................. *G02F 1/136286* (2013.01); *G02F 2001/13606* (2013.01)

(58) Field of Classification Search
   CPC ............................................... G02F 1/134336
   See application file for complete search history.

(56) References Cited

U.S. PATENT DOCUMENTS

| 8,953,133 | B2* | 2/2015 | Cho | G02F 1/133512 349/141 |
|---|---|---|---|---|
| 2006/0146254 | A1* | 7/2006 | Kim | G02F 1/134363 349/141 |
| 2007/0216842 | A1* | 9/2007 | Kawasaki | G02F 1/1368 349/141 |
| 2010/0066933 | A1* | 3/2010 | Oh | G02F 1/134363 349/38 |
| 2012/0033169 | A1* | 2/2012 | Lee | G02F 1/133512 349/139 |
| 2013/0016294 | A1* | 1/2013 | Li | G02F 1/134363 349/33 |
| 2013/0188106 | A1* | 7/2013 | Nishida | G02F 1/133512 349/33 |

* cited by examiner

*Primary Examiner* — Timothy L Rude
(74) *Attorney, Agent, or Firm* — Morgan, Lewis & Bockius LLP

(57) ABSTRACT

A liquid crystal display is provided which can avoid degradation of picture quality by preventing deviations in parasitic capacitance between a data line and a pixel electrode. The liquid crystal display includes data lines and gate lines, compensation patterns covering the data lines, thin film transistors disposed at regions neighbored to crossings of the data and gate lines, pixel electrodes disposed in pixel regions defined by the crossings and respectively connected to the thin film transistors; and a common electrode disposed to overlap the pixel electrodes, One edge of each of the compensation patterns is spaced apart from the pixel electrodes by a predetermined distance.

3 Claims, 7 Drawing Sheets

LIQUID CRYSTAL DISPLAY

This application claims the benefit of priority under 35 U.S.C. §119(a) to Korean Patent Application No. 10-2014-0119610 filed on Sep. 10, 2014, which is incorporated herein by reference for all purposes as if fully asset forth herein.

BACKGROUND OF THE INVENTION

1. Field of the Invention

The present disclosure relates to a liquid crystal display, and more particularly to, a liquid crystal display which can avoid degradation of picture quality by preventing deviations parasitic capacitance between data lines and pixel electrodes.

2. Discussion of the Related Art

In recent years, liquid crystal displays have been widely used among various types of display devices due to the features such as excellent picture quality, light weight, and low power consumption. A liquid crystal display displays images by controlling the light transmittance of liquid crystals with dielectric anisotropy. The liquid crystal display device includes a liquid crystal panel where liquid crystal cells are arranged in a matrix and a driving circuit for driving the liquid crystal panel.

The liquid crystal panel comprises a thin film transistor array substrate and a color filter array substrate. The thin film transistor array substrate comprises a thin film transistor having a gate electrode, a semiconductor layer, a source electrode, and a drain electrode, a pixel electrode connected to the thin film transistor, and a common electrode which is positioned opposite the pixel electrode to form an electric field with the pixel electrode. The color filter array substrate comprises color filters and a black matrix.

In the liquid crystal display, the liquid crystal panel is driven in an inversion manner in order to prevent deterioration of liquid crystals and improve display quality. Examples of the inversion method include a frame inversion method, a line inversion method, a column inversion method, a dot inversion method, a Z-inversion method, etc.

Of these inversion methods, the Z-inversion method is a method that supplies a pixel signal to data lines in a column inversion manner. In the Z-inversion method, thin film transistors and pixel electrodes are disposed in a zigzag pattern alternately on the left and right sides of the data line. That is, the Z-inversion method is an improved version of the column inversion method, in which circuits are driven in the column inversion manner and the thin film transistors of the liquid crystal panel are arranged in reversed directions for each data line to display an image on a screen in the same way as the dot-inversion method. The Z-inversion method produces an effect similar to the dot-inversion method and brings a drastic reduction in power consumption.

Hereinafter, a related art Z-inversion type liquid crystal display will be described with reference to FIG. 1. FIG. 1 is a top plan view illustrating a pixel array of the related art Z-inversion type liquid crystal display.

Referring to FIG. 1, a thin film transistor array substrate of the related art Z-inversion type liquid crystal display comprises a plurality of gate lines G1 and G2 and a plurality of data lines D1, D2, and D3 which are disposed to cross each other.

Pixel regions are defined by the crossings of the gate lines G1 and G2 and the data lines D1, D2, and D3. Pixel electrodes P1, P2, P3, and P4 are respectively disposed in the pixel regions.

Thin film transistors TFT1, TFT2, TFT3, and TFT4 are disposed at the crossing regions of the gate lines G1 and G2 and the data lines D1, D2, and D3. The thin film transistors TFT1, TFT2, TFT3, and TFT4 are arranged in a zigzag pattern alternately on the left and right sides along the data lines DL1, DL2, and DL3. Accordingly, the pixel electrodes P1, P2, P3, and P4 also are arranged in a zigzag pattern. That is, because the thin film transistors TFT1, TFT2, TFT3, and TFT4 and the pixel electrodes P1, P2, P3, and P4 are alternately arranged on the left and right sides along the data lines D1, D2, and D3, the thin film transistors TFT1 and TFT2 or TFT3 and TFT4 and the pixel electrodes P1 and P2 or P3 and P4, which are placed in a same column area defined by two neighboring data lines D1 and D2 or D2 or D3, are alternately connected to the neighboring data lines D1 and D2 or D2 and D3 for each horizontal line.

However, in the thin film transistor array substrate fabrication of the Z-inversion type liquid crystal display, there may be a process deviation between a source/drain layer forming process for forming data lines DL1, DL2, and DL3, source electrodes SE, and drain electrodes DE and a pixel electrode layer forming process for forming pixel electrodes P1, P2, P3, and P4. When this process deviation causes a shift between the source/drain layer and the pixel electrode layer, it generates a difference in parasitic capacitance between the pixel electrodes P3 and P4 and the data lines D1, D2, and D3.

Hereinafter, the generation of a difference in parasitic capacitance due to a process deviation will be described in detail with reference to FIG. 2. FIG. 2 is a view for explaining changes in parasitic capacitance between a data line and pixel electrodes, caused by a shift between a source/drain layer and a pixel electrode layer. (a) of FIG. 2 is a view showing the data line D2 and pixel electrodes P1 and P2 which are formed in a normal state, (b) of FIG. 2 is a view showing the pixel electrodes P1 and P2 which are shifted to the left side of the figure due to a process deviation, and (c) of FIG. 2 is a view showing pixel electrodes P1 and P2 which are shifted to the right side of the figure due to a process deviation.

Referring to (a) of FIG. 2, the data line D2 is at an equal distance from the pixel electrodes P1 and P2 on the left and right sides, so there is no deviation in parasitic capacitance due to a difference between the distance from the data line D2 to the pixel electrode P1 and the distance from the data line D2 to the pixel electrode P2.

However, as shown in (b) and (c) of FIG. 2, if a pixel electrode P is shifted to one side (e.g., the left or right side) due to a process deviation, it generates a difference between the distance from the data line D2 to the pixel electrode P1 and the distance from the data line D2 to the pixel electrode P2. This produces a deviation in parasitic capacitance due to the difference between the distance from the data line D2 to the pixel electrode P1 and the distance from the data line D2 to the pixel electrode P2.

Moreover, in the Z-inversion type liquid crystal display, the pixel electrodes P1 and P2, placed on the left and right sides of the data line D2, are charged with pixel signals having opposite polarities. Thus, the amount of voltage deviation between the data line D2 (−) and the left pixel electrode P1 (+) having opposite polarities is larger or smaller than the amount of voltage deviation between the data line D2 (−) and the right pixel electrode P2 (−) having the same polarity. Accordingly, this results in a greater deviation between a first parasitic capacitance between the data line D2 (−) and the left pixel electrode P1 (+) and a second parasitic capacitance between the data line D2 (−) and the right pixel electrode P1 (−).

Such a deviation in parasitic capacitance between the data line and the pixel electrodes causes a difference of kickback voltage ΔVp in pixel regions connected to the same data line through Z-inversion driving, thereby leading to a picture quality degradation such as an afterimage or flicker.

Therefore, a need for a liquid crystal display capable of preventing deviation in parasitic capacitance between pixel electrodes and data lines has been raised.

SUMMARY OF THE INVENTION

Accordingly, the present invention is directed to a liquid crystal display that substantially obviates one or more of the problems due to limitations and disadvantages of the related art.

An object of the present invention is to provide a liquid crystal display which can avoid degradation of picture quality by preventing deviations in parasitic capacitance between data lines and pixel electrodes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display comprises a plurality of data lines and a plurality of gate lines arranged to cross each other; a plurality of compensation patterns covering the data lines, respectively; a plurality of thin film transistors disposed at regions neighbored to crossings of the data lines and the gate lines; a plurality of pixel electrodes disposed in pixel regions defined by the crossings of the gate lines and the data lines and respectively connected to the plurality of thin film transistors; and a common electrode disposed to overlap the pixel electrodes, with a passivation film interposed therebetween, wherein one edge of each of the compensation patterns is spaced apart from the pixel electrodes by a predetermined distance.

In another aspect, a liquid crystal display comprises a plurality of data lines and a plurality of gate lines arranged to cross each other; a plurality of thin film transistors disposed at regions neighbored to crossings of the data lines and the gate lines; one pair of compensation patterns spaced apart from each of the data lines and arranged on both sides thereof; a plurality of pixel electrodes disposed in pixel regions defined by the crossings of the gate lines and the data lines and respectively connected to the thin film transistors; and a common electrode disposed to overlap the pixel electrodes, with a passivation film interposed therebetween, wherein each of the pixel electrodes is formed to partially cover one of the one pair of compensation patterns.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Figure 1:
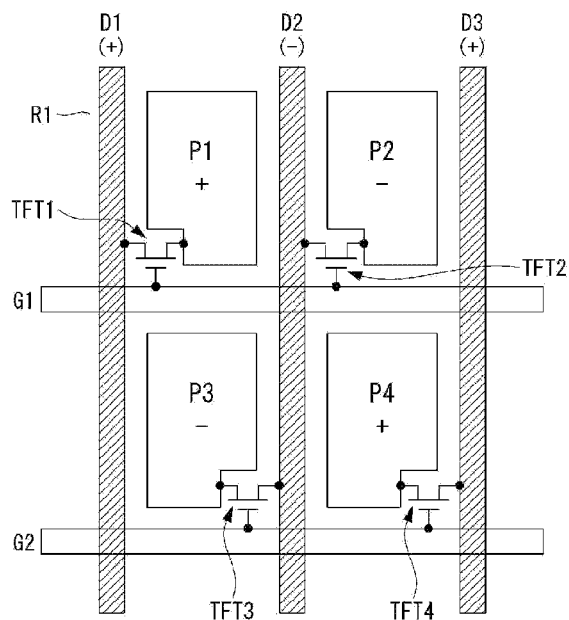
FIG. 1 is a top plan view illustrating a pixel array of the related art Z-inversion type liquid crystal display.

Hereinafter, exemplary embodiments of the present invention will be described in detail with reference to the accompanying drawings. Throughout the specification, the same reference numerals indicate the same components. In the following description, detailed descriptions of related well-known functions or configurations will be omitted if they would obscure the invention with unnecessary detail.

Figure 3:
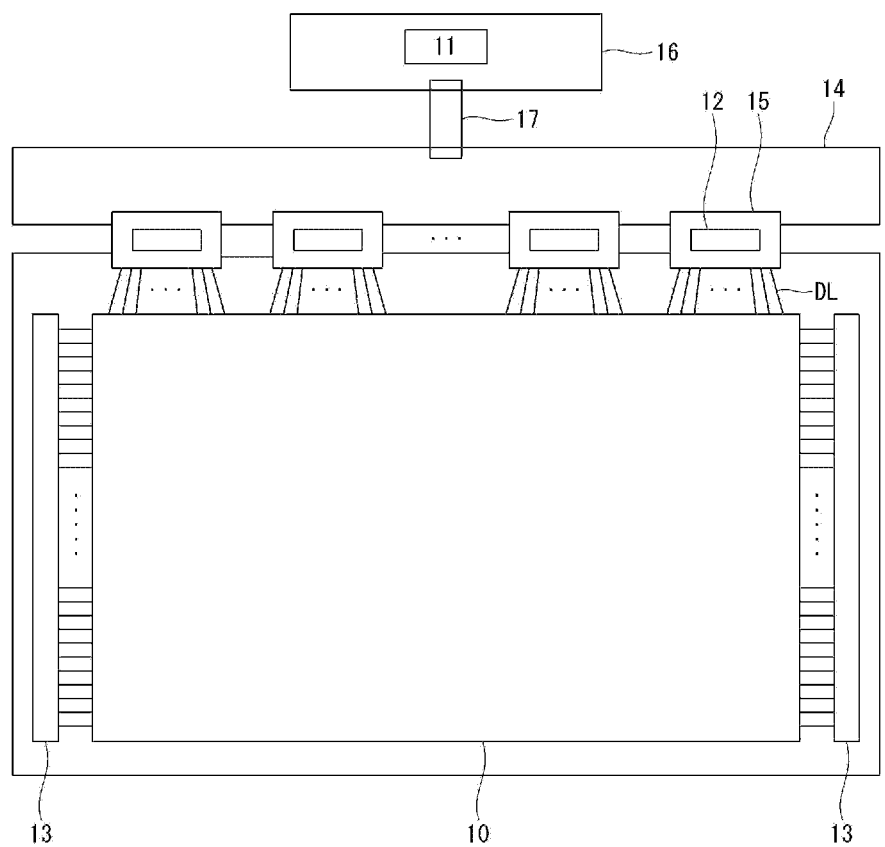
FIG. 3 is a block diagram illustrating a liquid crystal display according to an exemplary embodiment of the present invention.

A liquid crystal display according to an exemplary embodiment of the present invention will be described in detail with reference to FIG. 3. FIG. 3 is a block diagram illustrating a liquid crystal display according to an exemplary embodiment of the present invention.

Referring to FIG. 3, the liquid crystal display according to the exemplary embodiment of the present invention comprises a liquid crystal display panel with a pixel array 10, source drive ICs 12, and a timing controller 11. A backlight unit for uniformly irradiating light to the liquid crystal display panel may be disposed under the liquid crystal display panel.

The liquid crystal display panel comprises an upper glass substrate and a lower glass substrate facing each other with a liquid crystal layer interposed between them. A pixel array 10 is formed on the liquid crystal display panel. The pixel array 10 comprises liquid crystal cells arranged in a matrix format according to a crossing structure of data lines and gate lines, and displays data. The data lines, the gate lines, thin film transistors TFTS, pixel electrodes of the liquid crystal cells connected to the thin film transistors, and storage capacitors Cst connected to the pixel electrodes of the liquid crystal cells are formed on the lower glass substrate of the pixel array. Each of the liquid crystal cells of the pixel array 10 is driven by a voltage difference between the pixel electrode charged with a data voltage and a common electrode to which a common voltage is applied, and displays data by adjusting light transmittance. A detailed structure of the pixel array 10 will be described in detail with reference to FIG. 4.

A black matrix, color filters, and the common electrode are formed on the upper glass substrate of the liquid crystal display panel. The common electrode is formed on the upper glass substrate in a vertical electric field drive manner, such as a twisted nematic (TN) mode and a vertical alignment (VA) mode. The common electrode 2 and the pixel electrode 1 are formed on the lower glass substrate in a horizontal electric field drive manner, such as an in-plane switching (IPS) mode and a fringe field switching (FFS) mode.

Polarizers are attached respectively to the upper and lower glass substrates of the liquid crystal display panel. Alignment layers for setting a pre-tilt angle of the liquid crystals are respectively formed on the upper and lower glass substrates.

The liquid crystal display of this invention may be implemented in any liquid crystal mode, as well as the TN mode, VA mode, IPS mode, and FFS mode. The liquid crystal display of the present invention may be implemented in any form including a transmissive liquid crystal display, a refractive-transmissive liquid crystal display, and a reflective liquid crystal display. The transmissive liquid crystal display and the refractive-transmissive liquid crystal display require a backlight unit. The backlight unit may be a direct type backlight unit or an edge type backlight unit.

The source drive ICs 12 are mounted on a TCP (Tape Carrier Package) 15, bonded to the lower glass substrate of the liquid crystal display panel by a TAB (Tape Automated Bonding) process, and connected to a source PCB (Printed Circuit Board) 14. The source drive ICs 12 may be attached onto the lower glass substrate of the liquid crystal display panel by a COG (Chip On Glass) process. Individual data output channels of the source drive ICs 12 are connected one to one to the data lines of the pixel array 10.

Each of the source drive ICs 12 receives digital video data from the timing controller 11. The source drive ICS 12 convert digital video data into a positive/negative data voltage in response to a source timing control signal from the timing controller 11, and supplies it to the data lines DL of the pixel array 10 through the output channels. The source drive ICs 12 supply data voltages of opposite polarities to neighboring data lines DL under the control of the timing controller 11, and keep the polarity of the data voltages supplied to the data lines DL the same for one frame period. Accordingly, the source drive ICs 12 output data voltages whose polarity is inverted in a column inversion manner, as show in FIG. 4.

Figure 2:
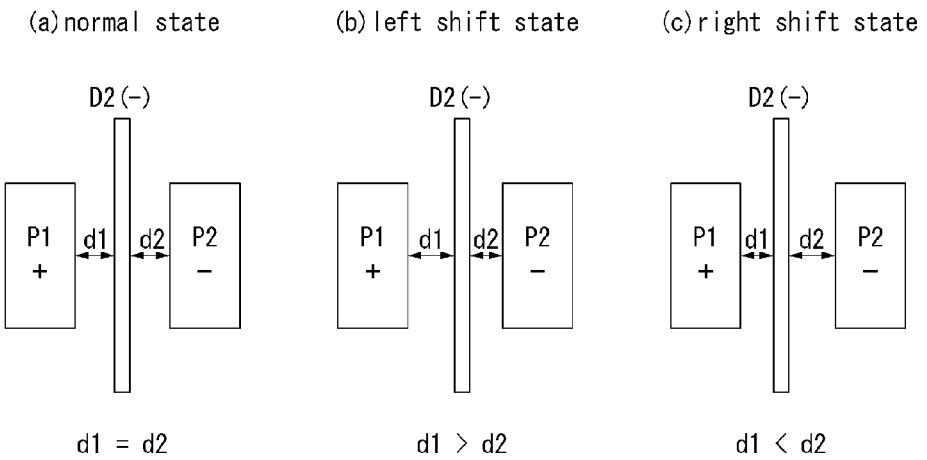
FIG. 2 is a view for explaining changes in parasitic capacitance between data lines and pixel electrodes, caused by a shift between a source/drain layer and a pixel electrode layer.

A gate drive circuit 13 sequentially supplies a gate pulse (or scan pulse) to the data lines GL of the pixel array in response to a gate timing control signal from the timing controller 11. The gate drive circuit 13 may be mounted on a TCP and bonded to the lower glass substrate of the liquid crystal display panel by a TAB process, or formed directly on the lower glass substrate simultaneously with the pixel array 10 by a GIP (Gate In Panel) process. The gate drive circuit 13 may be positioned on both sides of the pixel array 10, as shown in FIG. 2, or on one side of the pixel array 10.

The timing controller 11 supplies the digital video data received from an external system board to the source driver ICs 12. The timing controller 11 generates a source timing control signal for controlling the operation timing of the source driver ICs 12 and a gate timing control signal for controlling the operation timing of a gate drive circuit 13. The timing controller 11 is mounted on a control PCB 16. The control PCB 16 is connected to a source PCB 14 through a flexible circuit board 17, such as a flexible printed circuit (FPC) or a flexible flat cable (FFC).

Figure 4:
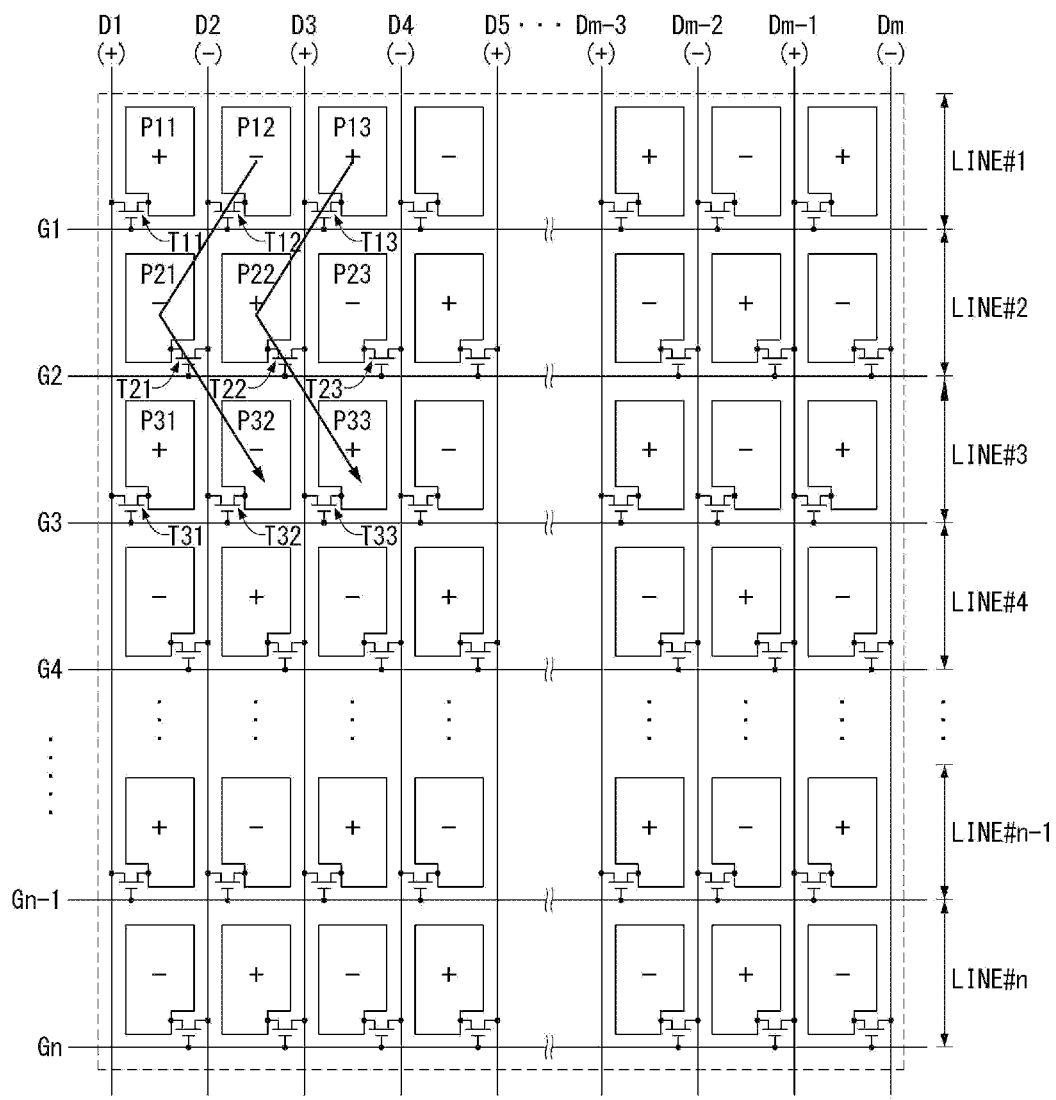
FIG. 4 is a circuit diagram illustrating one example of a pixel array of the liquid crystal display according to the exemplary embodiment of the present invention.

Next, the pixel array of the liquid crystal display according to the exemplary embodiment of the present invention will be described with reference to FIG. 4. FIG. 4 is a circuit diagram illustrating one example of the pixel array 10 of the liquid crystal display according to the exemplary embodiment of the present invention.

Referring to FIG. 4, the pixel array 10 comprises m data lines D1 to Dm (where m is a positive integer) and n gate lines G1 to Gn arranged to cross each other, thin film transistors T11, T12, T13, . . . , T21, T22, T23, . . . disposed by the crossings of the data lines D1 to Dm and the gate lines G1 to Gn, and liquid crystal cells comprising pixel electrodes P11, P12, P13, . . . , P21, P22, P23, . . . . The thin film transistors T11, T12, T13, . . . , T21, T22, T23, . . . supply a pixel signal from the data lines D1 to Dm to the pixel electrodes P11, P12, P13, . . . , P21, P22, P23, . . . of the liquid crystal cells in response to a gate pulse.

The thin film transistors T11, T12, T13, . . . , T21, T22, T23, . . . and the pixel electrodes P11, P12, P13, . . . , P21, P22, P23, . . . are arranged in a zigzag pattern alternately on the left and right sides of each data line along each data lines D1 to Dm. That is, the thin film transistors and pixel electrodes placed in the same column are alternately connected to different neighboring data lines for horizontal line LINE#1 to LINE#n.

For example, the thin film transistor T11 and pixel electrode P11 included in the first horizontal line LINE#1 of the first column are connected to the data line D1, and the thin film transistor T21 and pixel electrode P21 included in the second horizontal line LINE#2 of the first column are connected to the data line D2, and the thin film transistor T31 and pixel electrode P31 included in the third horizontal line LINE#3 of the first column are connected to the data line D1.

The thin film transistor T12 and pixel electrode P12 included in the first horizontal line LINE#1 of the second column are connected to the data line D2, and the thin film transistor T22 and pixel electrode P22 included in the second horizontal line LINE#2 of the second column are connected to the data line D3, and the thin film transistor T32 and pixel electrode P32 included in the third horizontal line LINE#3 of the second column are connected to the data line D2.

In this way, the thin film transistors T11, T12, T13, . . . , T31, T32, T33, . . . and pixel electrodes P11, P12, P13, . . . , P31, P32, P33, . . . of the odd horizontal lines connected to the odd gate lines G1, G3, . . . are connected to the left neighboring data lines D1, D2, and D3, and the thin film transistors T21, T22, T23, . . . and pixel electrodes P21, P22, P23, . . . of the even horizontal lines connected to the even gate lines G2, G4, . . . are connected to the right neighboring data lines D2, D3, and D4.

Accordingly, the pixel electrodes P11, P12, P13, . . . , P31, P32, P33, . . . of the odd horizontal lines LINE#1, LINE#3, . . . are charged with a pixel signal from the left neighboring data lines D1, D2, and D3 through the thin film transistors T11, T12, T13, . . . , T31, T32, T33, . . . . On the other hand, the pixel electrodes P21, P22, P23, . . . of the even horizontal lines LINE#2, LINE#4, . . . are charged with a pixel signal from the right neighboring data lines D2, D3, and D4 through the thin film transistors T21, T22, T23, . . . .

As described above, in the liquid crystal display according to the exemplary embodiment of the present invention, pixel signals of opposite polarities are respectively input into the odd data lines and the even data lines, and their polarity is inverted every frame in a column inversion manner. As the pixel electrodes are disposed in a zigzag pattern, through column inversion, along the data lines to which a pixel signal is supplied, the liquid crystal cells comprising the pixel electrodes are driven in a dot inversion manner.

Accordingly, the liquid crystal display according to the exemplary embodiment of the present invention can achieve improved picture quality by driving the liquid crystal cells in a dot inversion manner and reduce power consumption, compared to supplying a pixel signal in the dot inversion manner, by supplying a pixel signal to the data lines in a column inversion manner.

In the liquid crystal display according to the exemplary embodiment of the present invention, a compensation pattern covering a data line is formed on each data line at a predetermined distance from pixel electrodes, or a compensation pattern partially overlapping the pixel electrodes is formed at a predetermined distance from the data line. Accordingly, even if there is a difference between the distance of the data line to the pixel electrode on one side and the distance of the data line to the pixel electrode on the other side, this generates no difference in parasitic capacitance.

Figure 5:
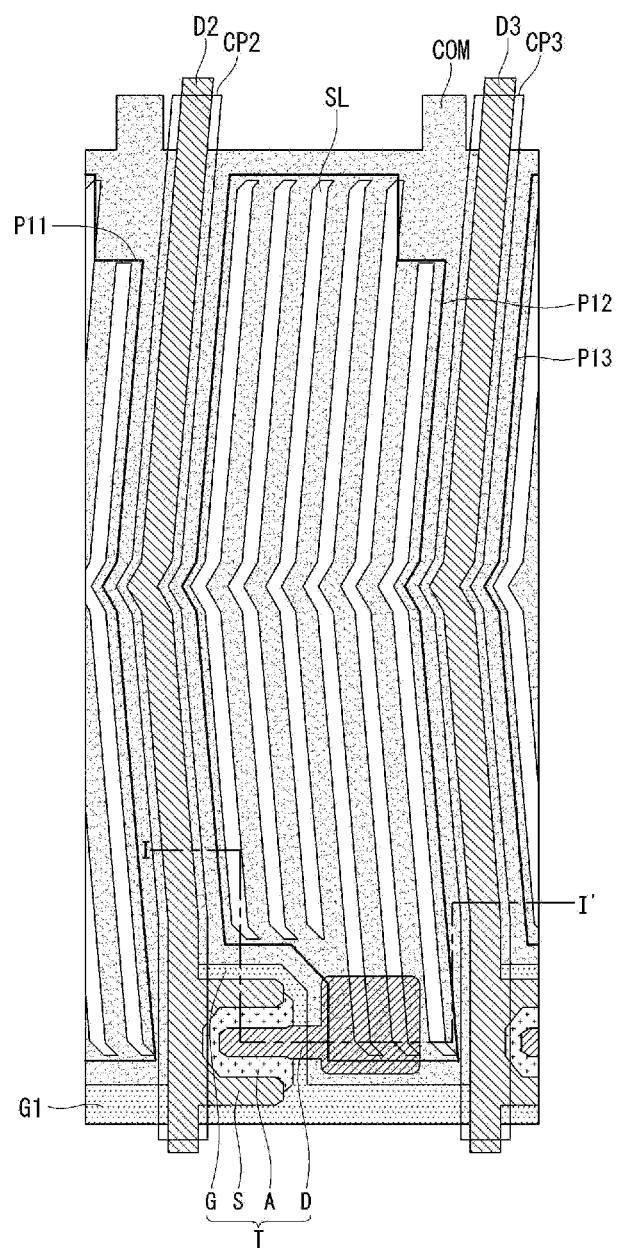
FIG. 5 is a top plan view illustrating one pixel of the liquid crystal display according to the first exemplary embodiment of the present invention.
Figure 6:
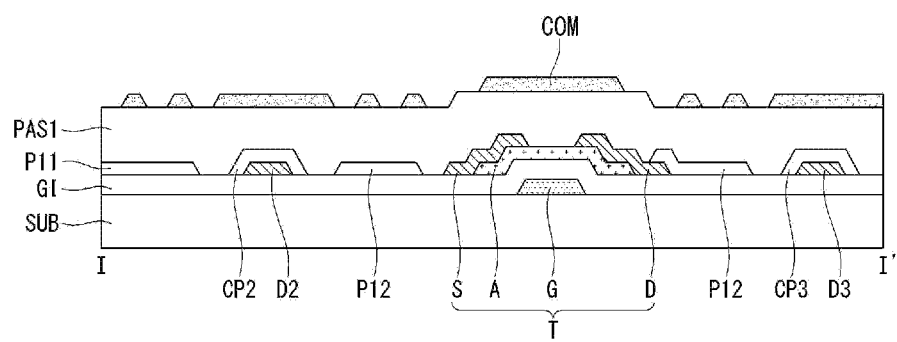
FIG. 6 is a cross-sectional view taken along the line I-I' of FIG. 5.

Hereinafter, a liquid crystal display according to a first exemplary embodiment of the present invention configured to generate no difference in parasitic capacitance will be described in more detail with reference to FIGS. 5 and 6. FIG. 5 is a top plan view illustrating one pixel of the liquid crystal display according to the first exemplary embodiment of the present invention. FIG. 6 is a cross-sectional view taken along the line I-I' of FIG. 5.

Referring to FIGS. 5 and 6, the liquid crystal display according to the first exemplary embodiment of the present invention comprises a gate line G1 formed on a substrate SUB, data lines D2 and D3 crossing the gate line G1, compensation patterns CP2 and CP3 respectively covering the data lines D2 and D3, a thin film transistor T disposed in each of the cell regions defined by the crossings of the gate line G1 and the data lines D2 and D3, a pixel electrode P12 connected to the thin film transistor T, and a common electrode COM disposed to overlap the pixel electrode P12 with a passivation film PAS1 interposed therebetween.

The thin film transistor T comprises a gate electrode G extending from the gate line G1 formed on the substrate SUB, a semiconductor active layer A formed on a gate insulation film GI covering the gate electrode G, and a source electrode S and a drain electrode D that are formed on the semiconductor active layer A and separated to face each other so as to expose part of the semiconductor layer A.

The data lines D2 and D3 and the pixel electrodes P11, P12, and P13 are formed on the gate insulation film GI.

The compensation patterns CP2 and CP3 are formed to cover the data lines D2 and D3. Each compensation pattern CP2 or CP3 is at an equal distance from the pixel electrodes P11 and P12; P12 and P13. As shown in FIGS. 5 and 6, the compensation patterns CP2 and CP3 and the pixel electrodes P11, P12, and P13 are formed in the same process using a transparent conductive material such as ITO (Indium Tin Oxide), IZO (Indium Zinc Oxide), or GZO (Gallium-doped Zinc Oxide).

After the data line formation process, even if the pixel electrodes are shifted due to a process deviation in the pixel electrode formation process, the distance between a compensation pattern and pixel electrodes positioned on both sides of the compensation pattern is kept constant because the compensation pattern covers the data line (i.e., the compensation pattern and the data line are electrically connected) and the pixel electrodes and the compensation pattern are simultaneously formed.

As described above, the liquid crystal display according to the first exemplary embodiment of the present invention has no deviation in parasitic capacitance since the distance between a data line and the pixel electrodes arranged on both sides of the data line is kept constant even if a process deviation occurs and therefore prevents picture quality degradation such as an afterimage or flicker.

Figure 7:
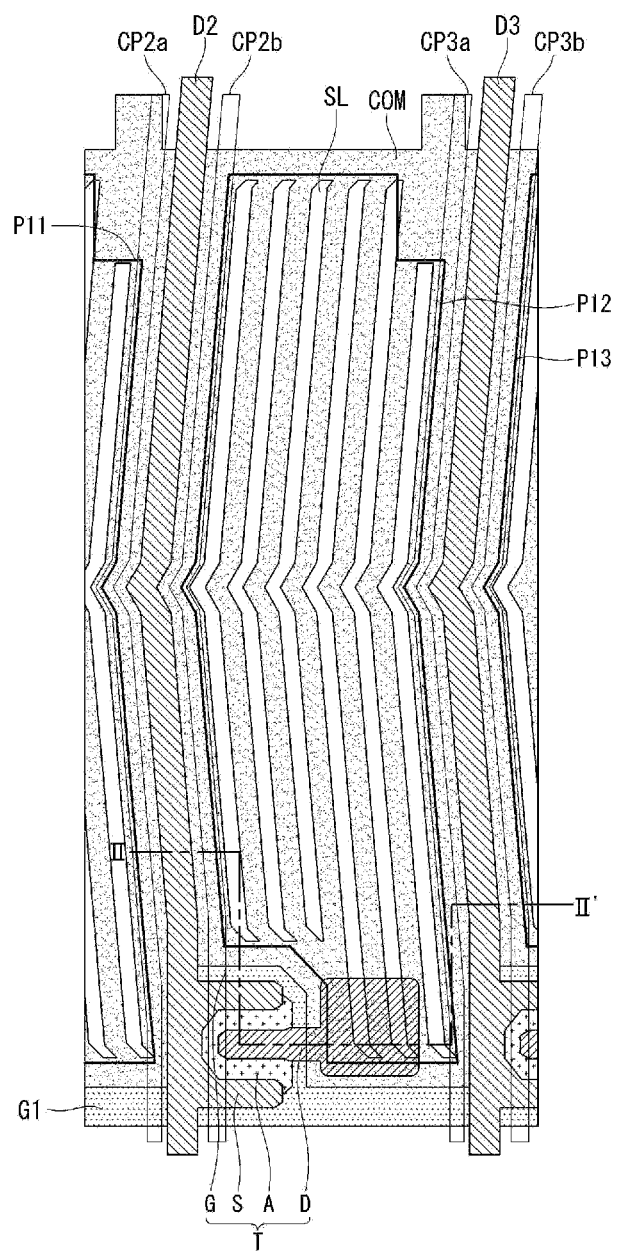
FIG. 7 is a top plan view illustrating one pixel of the liquid crystal display according to the second exemplary embodiment of the present invention.
Figure 8:
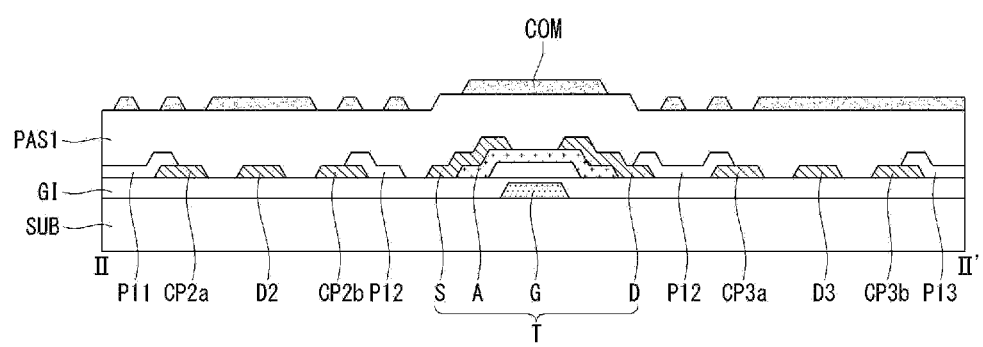
FIG. 8 is a cross-sectional view taken along the line I-I' of FIG. 7.

Next, a liquid crystal display according to a second exemplary embodiment of the present invention configured to generate no difference in parasitic capacitance will be described in more detail with reference to FIGS. 7 and 8. FIG. 7 is a top plan view illustrating one pixel of the liquid crystal display according to the second exemplary embodiment of the present invention. FIG. 8 is a cross-sectional view taken along the line I-I' of FIG. 7.

Referring to FIGS. 7 and 8, the liquid crystal display according to the second exemplary embodiment of the present invention comprises a gate line G1 formed on a substrate SUB, data lines D2 and D3 crossing the gate line G1, a thin film transistor T formed in each of the cell regions defined by the crossings of the gate line G1 and the data lines D2 and D3, two pairs of compensation patterns CP2a and CP2b; and CP3a and CP3b respectively spaced apart from the data lines D2 and D3 and arranged on both sides of the data lines D2 and D3, a pixel electrode P12 connected to the thin film transistor T, and a common electrode COM disposed to overlap the pixel electrode P12.

The thin film transistor T comprises a gate electrode G extending from the gate line G1 formed on the substrate SUB, a semiconductor active layer A formed on a gate insulation film GI covering the gate electrode G, and a source electrode S and a drain electrode D that are formed on the semiconductor active layer A and separated to face each other so as to expose part of the semiconductor layer A.

The data lines D2 and D3 and the two pairs of compensation patterns CP2a and CP2b; and CP3a and CP3b arranged on both sides of the data lines D2 and D3 are formed on the gate insulation film GI. Each data line D2 or D3 is at an equal distance from the pair of compensation patterns CP2a and CP2b; or CP3a and CP3b.

Each of the pixel electrodes P11 and P12 arranged on both sides of the data line D2 is formed to cover at least part of the pair of compensation patterns CP2a and CP2b arranged on both sides of the data line D2.

Each data line D2 or D3 is at an equal distance from the pair of compensation patterns CP2a and CP2b; or CP3a and CP3b. As shown in FIGS. 7 and 8, the compensation patterns CP2 and CP2b; and CP3a and CP3b and the data lines D2 and D3 are formed in the same process using a conductive metal material.

After the process of formation of the data lines D2 and D3 and the compensation patterns CP2a and CP2b; and CP3a and CP3b, even if the pixel electrodes are shifted due to a process deviation in the pixel electrode formation process, the distance between a data line and the compensation patterns positioned on both sides of the data line is kept constant because the pixel electrodes covers the compensation patterns (i.e., the pixel electrodes and the compensation patterns are electrically connected) and the data line and the compensation patterns are simultaneously formed.

Accordingly, the liquid crystal display according to the second exemplary embodiment of the present invention has no deviation in parasitic capacitance since the distance between a data line and compensation patterns connected to the pixel electrodes arranged on both sides of the data line is kept constant even if a process deviation occurs and therefore prevents picture quality degradation, such as an afterimage or flicker.

It will be apparent to those skilled in the art that various modifications and variations can be made in the liquid crystal display of the present invention without departing from the spirit or scope of the invention. Thus, it is intended that the present invention cover the modifications and variations of this invention provided they come within the scope of the appended claims and their equivalents.

What is claimed is:

1. A liquid crystal display, comprising:
   a plurality of data lines and a plurality of gate lines arranged to cross each other;
   a plurality of thin film transistors disposed at regions neighbored to crossings of the data lines and the gate lines;
   one pair of compensation patterns spaced apart from each of the data lines and arranged on both sides thereof;
   a plurality of pixel electrodes disposed in pixel regions defined by the crossings of the gate lines and the data lines and respectively connected to the thin film transistors; and
   a common electrode disposed to overlap the pixel electrodes, with a passivation film interposed therebetween,
   wherein each of the pixel electrodes is formed to partially cover one of the one pair of compensation patterns.

2. The liquid crystal display of claim 1, wherein the compensation patterns and the pixel electrodes are made of the same material.

3. The liquid crystal display of claim 1, wherein the data lines are disposed on a gate insulation film covering the gate electrodes of the thin film transistors, the data lines and the one pair of compensation patterns are disposed on the gate insulation film, and each of the data lines is at an equal distance from the compensation patterns positioned on both sides thereof.

* * * * *